United States Patent
Chen

(10) Patent No.: US 11,837,473 B2
(45) Date of Patent: Dec. 5, 2023

(54) METHODS FOR NEAR SURFACE WORK FUNCTION ENGINEERING

(71) Applicant: Applied Materials, Inc., Santa Clara, CA (US)

(72) Inventor: Taichou Papo Chen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 86 days.

(21) Appl. No.: 17/736,188

(22) Filed: May 4, 2022

(65) Prior Publication Data

US 2023/0230838 A1    Jul. 20, 2023

(30) Foreign Application Priority Data

Jan. 20, 2022  (WO) ................ PCT/US2022/013044

(51) Int. Cl.
  *H01L 21/225* (2006.01)
  *H01L 21/02* (2006.01)
  *H10N 70/00* (2023.01)

(52) U.S. Cl.
  CPC .... *H01L 21/2255* (2013.01); *H01L 21/02252* (2013.01); *H10N 70/046* (2023.02)

(58) Field of Classification Search
  CPC ........... H01L 21/2255; H01L 21/02252; H01L 21/02057; H01L 21/28088; H10N 70/046
  See application file for complete search history.

(56) References Cited

U.S. PATENT DOCUMENTS

| | | | |
|---|---|---|---|
| 4,525,378 A | 6/1985 | Schwabe et al. | |
| 7,575,941 B2 * | 8/2009 | Chang | H01L 31/1864 257/E31.115 |
| 8,470,684 B2 | 6/2013 | Pei et al. | |
| 8,502,308 B2 | 8/2013 | Schrems et al. | |
| 9,406,746 B2 * | 8/2016 | He | H01L 21/31122 |
| 10,546,937 B2 | 1/2020 | Singh et al. | |
| 2006/0068590 A1 | 3/2006 | Lindert et al. | |
| 2010/0233869 A1 | 9/2010 | Park et al. | |
| 2011/0240997 A1 * | 10/2011 | Rockenberger | H01L 21/0243 257/E21.09 |
| 2015/0348784 A1 | 12/2015 | Granahan | |

OTHER PUBLICATIONS

PCT International Search Report and Written Opinion for PCT/US2022/013044 dated Oct. 20, 2022.

* cited by examiner

*Primary Examiner* — Dale E Page
*Assistant Examiner* — Quovaunda Jefferson
(74) *Attorney, Agent, or Firm* — MOSER TABOADA

(57) ABSTRACT

Methods for adjusting a work function of a structure in a substrate leverage near surface doping. In some embodiments, a method for adjusting a work function of a structure in a substrate may include growing an epitaxial layer on surfaces of the structure to form a homogeneous passivation region as part of a substrate material of the substrate and performing a dopant diffusion process to further embed the dopants into surfaces of the structure to adjust a work function of the structure, wherein the dopant diffusion process is performed at less than approximately 450 degrees Celsius.

20 Claims, 5 Drawing Sheets

METHODS FOR NEAR SURFACE WORK FUNCTION ENGINEERING

CROSS-REFERENCE TO RELATED APPLICATIONS

This application claims priority to International Patent Application No. PCT/US2022/013044, filed Jan. 20, 2022, and entitled "METHODS FOR NEAR SURFACE WORK FUNCTION ENGINEERING", the contents of which are hereby incorporated by reference in its entirety.

FIELD

Embodiments of the present principles generally relate to semiconductor processing of semiconductor substrates.

BACKGROUND

Structures, such as trenches, are often formed on substrates as part of constructing a semiconductor device. Bulk processing and high temperatures are typically used to alter the work function of the structures. However, the inventor has found that during such processes, the high temperatures may damage surrounding devices and also cause large charge gradients areas to be formed in the structures, reducing the area available for other device layers, causing a substantial decrease in performance.

Accordingly, the inventor has provided improved processes for near surface work function engineering that substantially increases performance and quantum efficiencies of structures.

SUMMARY

Methods and structures for improved near surface work function engineering are provided herein.

In some embodiments, a method of adjusting a work function of a structure on a substrate may comprise growing an epitaxial layer on surfaces of the structure to form a homogeneous passivation region with dopants as part of a substrate material of the substrate and performing a dopant diffusion process to further embed the dopants into surfaces of the structure to adjust the work function of the structure, wherein the dopant diffusion process is performed at less than approximately 450 degrees Celsius.

In some embodiments, the method may further include wherein the dopant diffusion process yields a charge in surfaces of the structure of up to plus or minus approximately $3e18/cm^3$ to approximately $3e21/cm^3$, wherein the dopants are P-type or N-type, wherein the dopant diffusion process forms an abrupt junction profile, wherein the method is performed in a back-end-of-line (BEOL) process, wherein the epitaxial layer is formed of single crystals, wherein the epitaxial layer is a non-crystal layer, growing the epitaxial layer using a low temperature process of less than approximately 450 degrees Celsius, forming the structure using an etch process, forming an oxide layer on surfaces of the structure with a dry oxide process at a temperature of less than approximately 450 degrees Celsius with a controllable oxidation thickness of approximately 1 nm to approximately 15 nm, and selectively removing the oxide layer from surfaces of the structure prior to growing the epitaxial layer, wherein the dry oxide process is performed in a plasma oxidation chamber, and/or etching the structure into the substrate to a high aspect ratio of greater than approximately 75:1.

In some embodiments, a method of adjusting a work function of a structure on a substrate may comprise forming a non-crystal material layer with a low temperature process on surfaces of the structure to form a homogeneous passivation region with dopants as part of a substrate material of the substrate and performing a dopant diffusion process to further embed the dopants into surfaces of the structure to adjust the work function of the structure and to form an oxide layer from the non-crystal layer, wherein the dopant diffusion process is performed at less than approximately 450 degrees Celsius and forms a charge layer with an abrupt junction profile.

In some embodiments, the method may further include wherein the dopant diffusion process yields a charge in surfaces of the structure of up to plus or minus approximately $3e18/cm^3$ to approximately $3e21/cm^3$, wherein the dopants are P-type or N-type, wherein the method is performed in a back-end-of-line (BEOL) process, wherein the dopant diffusion process is a condensation-based process that embeds the dopants and forms the oxide layer, and/or wherein the non-crystal material layer is formed at a temperature of less than 450 degrees Celsius and the dopant diffusion process is performed at a temperature of less than 450 degrees Celsius.

In some embodiments, a non-transitory, computer readable medium having instructions stored thereon that, when executed, cause a method for adjusting a work function of a structure in a substrate to be performed, the method may comprise growing an epitaxial layer on surfaces of the structure to form a homogeneous passivation region as part of a substrate material of the substrate and performing a dopant diffusion process to further embed the dopants into surfaces of the structure to adjust the work function of the structure, wherein the dopant diffusion process is performed at less than approximately 450 degrees Celsius.

In some embodiments, the method of the non-transitory, computer readable medium may further include wherein the dopant diffusion process yields a charge in surfaces of the structure of up to plus or minus approximately $3e18/cm^3$ to approximately $3e21/cm^3$ and forms an abrupt junction profile and/or growing the epitaxial layer using a low temperature process of less than approximately 450 degrees Celsius.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
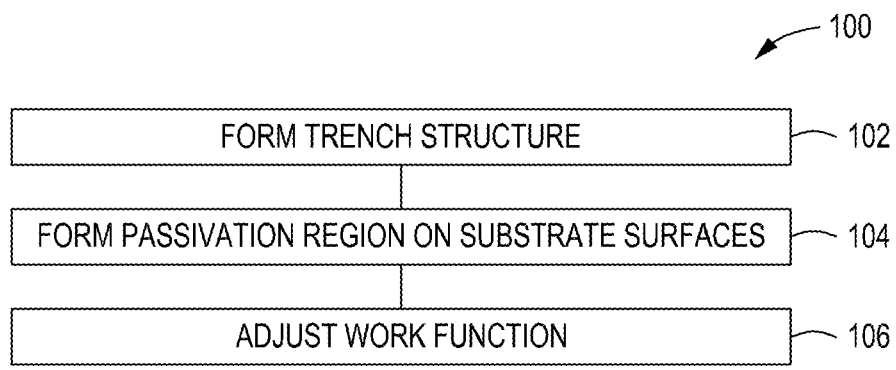
FIG. 1 is a method of adjusting a work function of surfaces of a trench structure in a substrate in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide a high-performance near surface work function engineering solution that dramatically increases charge manipulation capabilities in surfaces of structures such as trenches and the like. The methods provide innovative dopant and junction formation with precise profile control without the thermal budget constraints found in traditional processes. The techniques enable abrupt junction formation of charges near surfaces with ultra-high activated doping without crystal damage. In addition, the techniques allow use in back-end-of-line (BEOL) processes without fear of thermal damage to existing structures on a substrate. The methods are also compatible with surfaces of high aspect ratio structures of greater than 100:1.

Figure 2A:
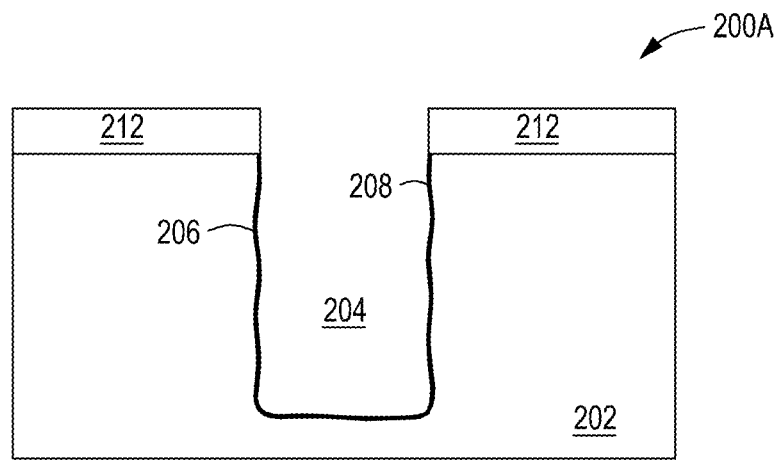
FIG. 2A depicts a cross-sectional view of a trench structure after an etching process in accordance with some embodiments of the present principles.

Although a trench is used for the sake of brevity in the following examples, other structures may benefit from the methods of the present principles and, therefore, the use of a trench in the examples is not meant to be limiting. For example, the techniques of the present principles may also be used for planar structures as well. FIG. 1 is a method 100 of adjusting a work function of a trench structure 204 in a substrate 202 in accordance with some embodiments. In block 102, in some embodiments, an etching process, for example, forms a trench structure 204 into the substrate 202 as depicted in view 200A of FIG. 2A. The etching process typically uses a hardmask layer 212 that protects areas from the etching process. In some embodiments, the aspect ratio of the trench structure 204 is at least approximately 50:1. In some embodiments, the aspect ratio of the trench structure 204 is at least approximately 75:1. In some embodiments, the aspect ratio of the trench structure 204 is at least approximately 100:1. As a side effect of the etching process, damage 208 occurs to the surfaces 206 of the trench structure 204. The damage 208 may include crystal damage of the substrate material, contaminants or residue from the etching process, and/or dangling bonds of the substrate material and the like. The hardmask layer 212 is removed after the etching process is completed.

Figure 2B:
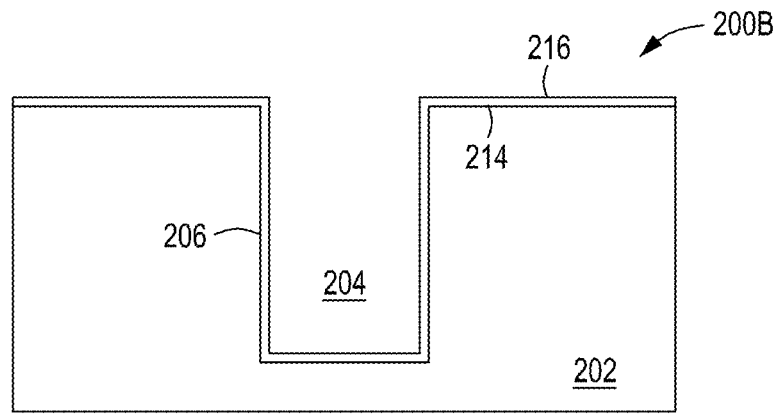
FIG. 2B depicts a cross-sectional view of a trench structure after a dry oxide process in accordance with some embodiments of the present principles.

To further prepare the trench structure 204, in some embodiments, an oxide layer 216 is formed on the substrate 202 using a dry oxidation process. As depicted in a view 200B of FIG. 2B, the field 214 or top surfaces of the substrate 202 and the surfaces 206 of the trench structure 204 undergo a dry oxidation process to form an oxide layer 216 that partially consumes the material of the substrate 202 including damaged portions. The dry oxidation process can be performed at temperatures of less than 450 degrees Celsius and produce less contamination and residue when compared to wet oxidation processes. In addition, dry oxidation processes can be used in substantially higher aspect ratio structures (e.g., greater than 100:1 aspect ratios) than wet oxidation (e.g., less than 50:1 aspect ratios). In some embodiments, the dry oxidation process is performed with a plasma oxidation chamber with or without a remote plasma source. The dry oxidation process facilitates in embedding oxygen into the surfaces 206 of the trench structure 204 to repair damage to the surfaces 206 and reduce stress induced leakage current (SILC) and interface trap densities ($D_{it}$).

Figure 2C:
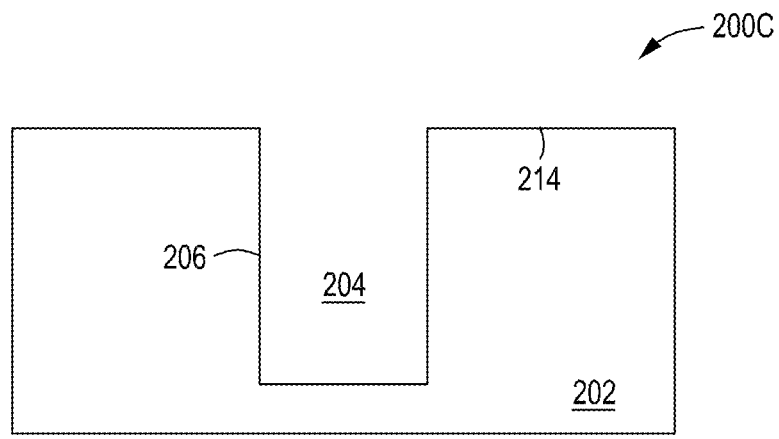
FIG. 2C depicts a cross-sectional view of a trench structure after a selective oxide removal process in accordance with some embodiments of the present principles.

The dry oxidation process can also be controlled to provide different thicknesses of the oxide layer 216. Parameters such as exposure time, plasma density, temperature and the like can facilitate in determining an oxidation rate. The thickness is then controlled by the duration of the dry oxidation process. In conventional methods such as wet oxidation, the oxidizing process is self-limiting (wet oxidation process is self-terminating) and oxide layer thicknesses cannot be adjusted. Wet oxidation typically stops at 1 nm to 2 nm of thickness at the saturation point. Dry oxidation does not have a saturation point and is not self-limiting allowing any level of thickness to be obtained. In some embodiments, the dry oxidation processes can achieve conformality in the trench structure 204 of greater than 95% for trenches with an aspect ratio of greater than 100:1, enabling scaling of trench isolation structures using the present principles. In some embodiments, the oxide layer 216 is selectively removed from the surfaces 206 of the trench structure 204 and the field 214 of the substrate 202 as depicted in a view 200C of FIG. 2C. In some embodiments, plasma-based chambers can be used to selectively remove the oxide layer 216 with selectivity ratios of, for example, greater than 50:1 (e.g., oxide over Si or SiGe). The selective removal of the oxide layer 216 removes all of the oxide layer 216 without damaging any of the underlying material of the substrate 202 or creating contaminants/residue, leaving damage free surfaces of the trench structure 204.

Figure 2D:
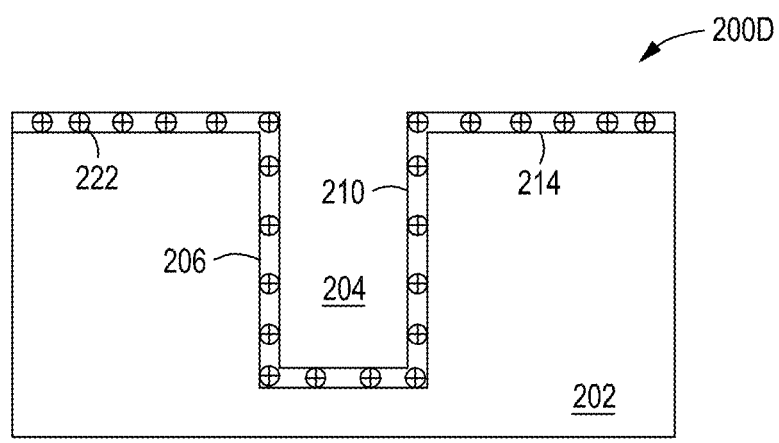
FIG. 2D depicts a cross-sectional view of a trench structure after a forming passivation region in accordance with some embodiments of the present principles.
Figure 4A:
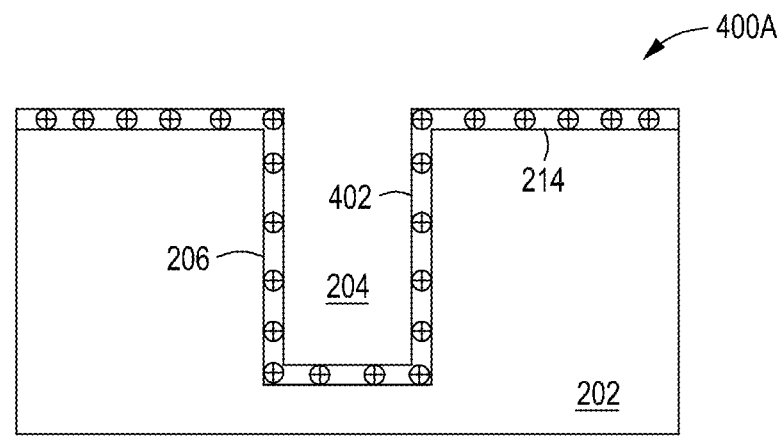
FIG. 4A depicts a first process of a second approach in accordance with some embodiments of the present principles.
Figure 4B:
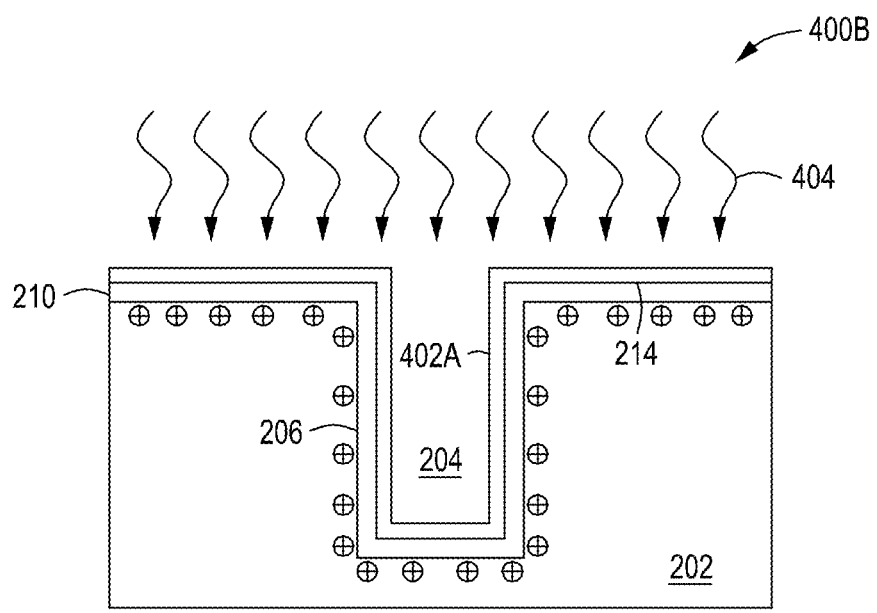
FIG. 4B depicts a second process of a second approach in accordance with some embodiments of the present principles.

In block 104, a passivation region 210 is formed on the surfaces 206 of the trench structure 204 and the field 214 of the substrate 202 as depicted in a view 200D of FIG. 2D. In some embodiments, the passivation region 210 is formed of homogeneous material similar to the material of the substrate 202. The passivation region 210 is formed by single crystals of the material with a species of dopants 222 (P-type species shown but not meant to be limiting) incorporated to form a positive charge or a negative charge (e.g., silicon doped with boron, gallium, phosphor, arsenic, etc.) on the substrate 202 and can be fabricated by two approaches. The first approach is with a low temperature epitaxial growth process using temperatures of less than approximately 450 degrees Celsius. The second approach is a two-part process in which the first part is to form a non-crystal doped material layer 402 on the field 214 as depicted in a view 400A of FIG. 4A followed by a second part including a material engineering process 404 such as oxidation or thermal treatment to drive dopants from the non-crystal doped material layer 402 into the surface of the substrate 202 as depicted in a view 400B of FIG. 4B. The non-crystal doped material layer 402 becomes an oxide layer 402A. Thus, the passivation region 210 can be formed as single crystal material under the field 214 or as a non-crystal material layer under the field 214.

In essence, the passivation region 210 becomes part of or an extension of the substrate material and does not form an interface between the passivation region 210 and the substrate 202, eliminating an interface commonly found in conventional processes that form a heterogeneous passivation region. The passivation region 210 also does not have any optical penalty as photons pass through the passivation region 210 as the photons would through the material of the substrate 202 without any degradation or change in path (refraction). The growth of the charge layer of the passivation region 210 also serves in repairing dangling bonds of the surfaces 206 of the trench structure 204 caused during trench etching processes. In some embodiments, the portion of the passivation region 210 on the field 214 of the substrate 202 may be removed, leaving only the portion of the passivation region 210 in the trench structure 204. In some embodiments, the passivation region 210 can incorporate species used for engineering material properties such as energy band, light sensitivity, etc. and can have gradient composition transition from the substrate 202 to the passivation region 210 to avoid the interface formation.

Figure 2E:
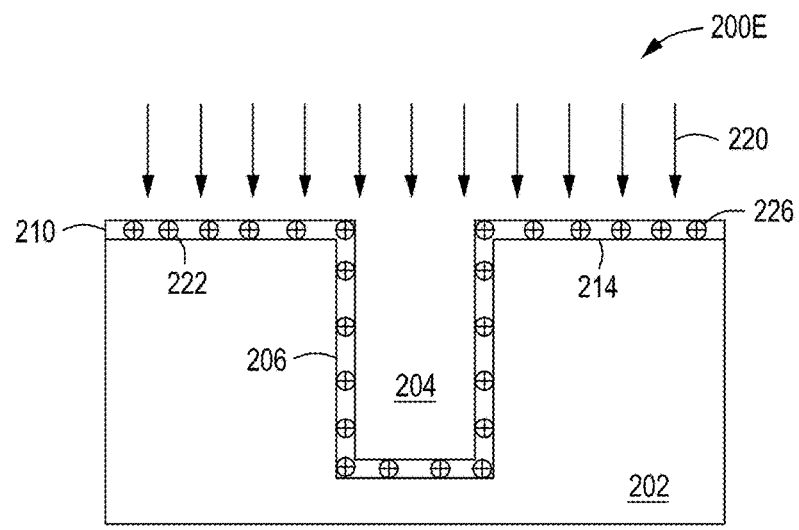
FIG. 2E depicts a cross-sectional view of a trench structure after an optional gas doping of the passivation region in accordance with some embodiments of the present principles.

Optionally, in some embodiments, the passivation region 210 may be formed without dopants which are then introduced via gases 220 as depicted in a view 200E of FIG. 2E. In further optional embodiments, the passivation region 210 may be formed with dopants and then enhanced with additional dopants by exposure to gases. The substrate 202 is exposed to gases 220 including dopants 222B that embed in the passivation region 210 on the field 214 of the substrate 202 and the surfaces 206 of the trench structure 204. The dopants 222B (as shown) in FIG. 2E have a positive charge for the sake of brevity and is not meant to be limiting. The dopants 222B may also have a negative charge (not shown). Gases 220 can also incorporate species such as Ge, carbon, for material engineering purposes on composition, energy band, light sensitivity, etc. The density of the dopants 222B and/or the type of the dopants 222B may be adjusted to provide a given plus or minus charge level as required for the trench structure 204.

Figure 2F:
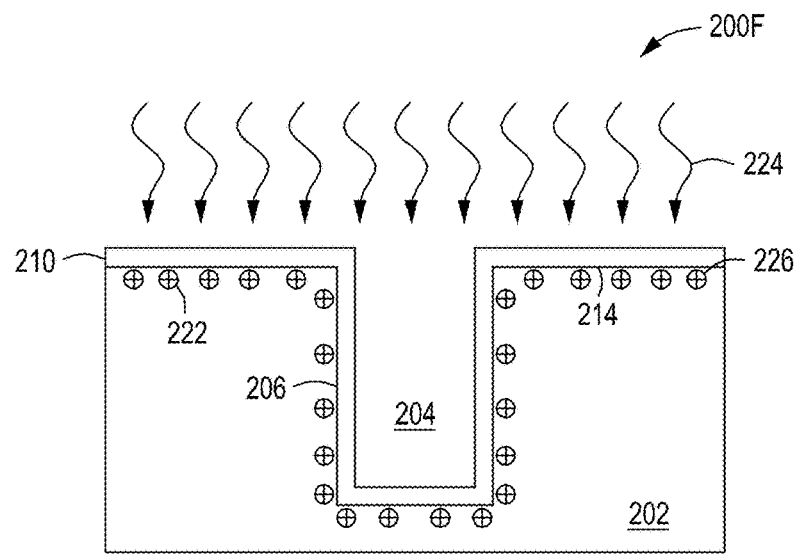
FIG. 2F depicts a cross-sectional view of a trench structure after a work function is adjusted in accordance with some embodiments of the present principles.

In block 106, a work function of the passivation region 210 can be adjusted as depicted in a view 200F of FIG. 2F. In some embodiments, a charge layer 226 is formed in-situ during the formation of the passivation region 210. A work function of the trench structure 204 is also adjusted by varying dopant densities, dopant types, and dopant depths as follows. The density of the dopants 222 and/or the type of the dopants 222 may be adjusted to provide a given plus or minus charge level as required for the trench structure 204 and a given work function. The dopants 222 and/or species different from substrate 202 are further embedded into the material of the substrate 202 by a dopant diffusion process 224 to further adjust the work function of the trench structure 204. A higher work function near a surface can facilitate or increase the carrier mobility inside of an adjacent structure such as a pixel structure and reduce the sensitivity to the surface recombination. The above techniques allow for substantially flexibility in engineering the work function through dopant depth, density, and type adjustments while increasing adjacent structure area by using abrupt junction profiles.

In some embodiments, the dopant diffusion process 224 may be a millisecond anneal process that uses high power and high temperature lasers (e.g., 700 degrees Celsius to 900 degrees Celsius) that are pulsed in the millisecond range to anneal the substrate 202 without heating the substrate to high temperatures. The dopant diffusion process 224 embeds the charge layer 226 in the material of the substrate 202 adjacent to the passivation region. In some embodiments, a plasma oxidation process may be performed on the substrate 202 as the dopant diffusion process 224 to drive the dopants 222 and the charge layer 226 further into the substrate 202 than can be obtained with the millisecond anneal process. In some embodiments, a combination of the millisecond anneal process and the plasma oxidation process may be used as the dopant diffusion process 224.

Figure 2G:
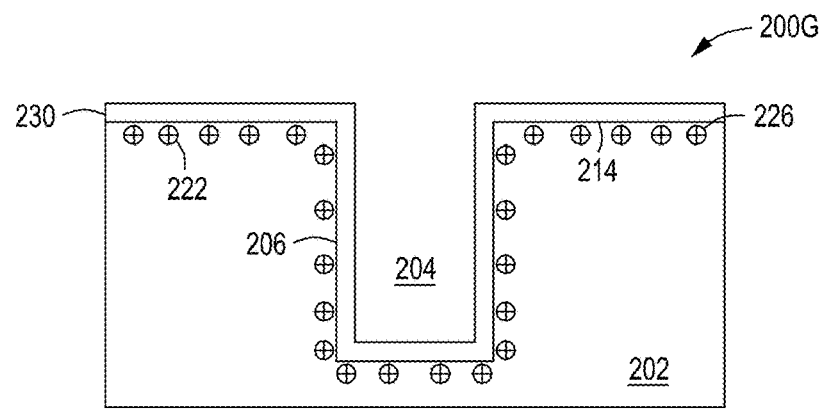
FIG. 2G depicts a cross-sectional view of a trench structure after an alternative method of a dopant diffusion process in accordance with some embodiments of the present principles.

The dopant diffusion process 224 yields an abrupt charge boundary or abrupt junction profile or abrupt composition transition in the material of the substrate 202 that increases the effective area of an adjacent structure (e.g., a pixel structure area, etc.) as opposed to conventional techniques that form a gradient charge region that requires more area to be used adjacent to the trench structure, reducing performance of adjacent structures. In some embodiments, a charge layer may have a charge formation of up to plus or minus approximately $3e18/cm^3$ to approximately $3e21/cm^3$ depending on permitted temperature and pressure (higher temperature and/or higher pressure yield higher charge densities). The charge layer may be formed homogeneously or heterogeneously. The charge layer of the present principles has near 100% dopant activation as processed without the need of any post activation treatment. In some embodiments, the above processes may be performed without an air break to prevent surface impurities, contaminants, and/or particle generation. In some embodiments, the growth of the charge layer of the passivation region 210 can be oxidized by condensation to both drive the dopants further into the material of the substrate 202 and form an oxide layer 230 as depicted in a view 200G of FIG. 2G. In effect, the passivation region 210 produces a liner layer 218 and embedded charge layer without an anneal process such as the millisecond anneal process discussed above. In addition, the charge layer can be non-crystal rather than single crystal growth.

Figure 3:
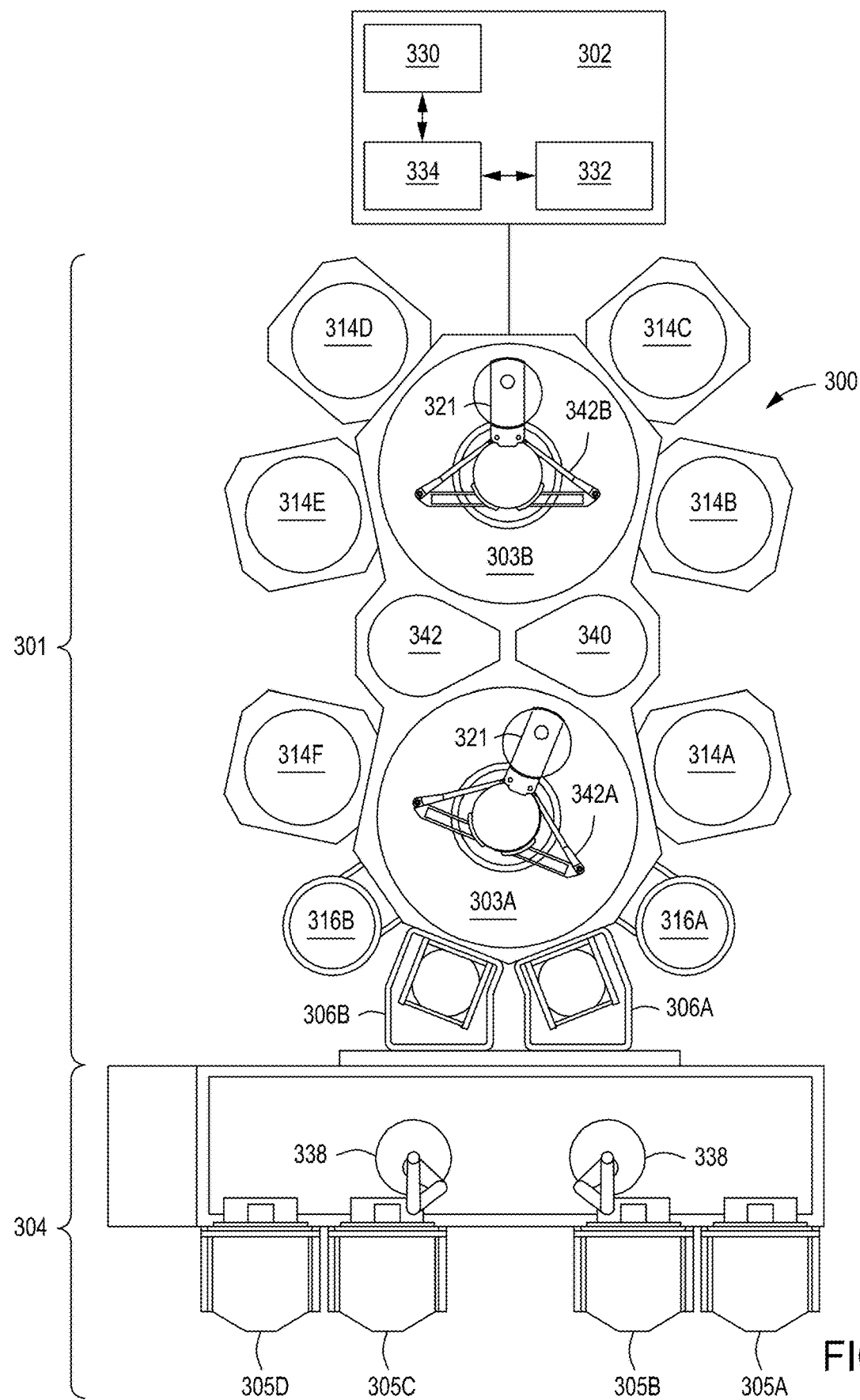
FIG. 3 depicts an integrated tool in accordance with some embodiments of the present principles.

The methods described herein may be performed in individual process chambers that may be provided in a standalone configuration or as part of a cluster tool, for example, an integrated tool 300 (i.e., cluster tool) described below with respect to FIG. 3. The advantage of using an integrated tool 300 is that there is no vacuum break and, therefore, no requirement to degas and pre-clean a substrate before treatment in a chamber. For example, in some embodiments the inventive methods discussed above may advantageously be performed in an integrated tool such that there are limited or no vacuum breaks between processes, limiting or preventing contamination of the substrate. The integrated tool 300 includes a vacuum-tight processing platform 301, a factory interface 304, and a system controller 302. The processing platform 301 comprises multiple processing chambers, such as 314A, 313B, 314C, 314D, 314E, and 314F operatively coupled to a vacuum substrate transfer chamber (transfer chambers 303A, 303B). The factory interface 304 is operatively coupled to the transfer chamber 303A by one or more load lock chambers (two load lock chambers, such as 306A and 306B shown in FIG. 3).

In some embodiments, the factory interface 304 comprises at least one docking station 307, at least one factory interface robot 338 to facilitate the transfer of the semiconductor substrates. The docking station 307 is configured to accept one or more front opening unified pod (FOUP). Four FOUPS, such as 305A, 305B, 305C, and 305D are shown in the embodiment of FIG. 3. The factory interface robot 338 is configured to transfer the substrates from the factory interface 304 to the processing platform 301 through the load lock chambers, such as 306A and 306B. Each of the load lock chambers 306A and 306B have a first port coupled to the factory interface 304 and a second port coupled to the transfer chamber 303A. The load lock chamber 306A and 306B are coupled to a pressure control system (not shown) which pumps down and vents the load lock chambers 306A and 306B to facilitate passing the substrates between the vacuum environment of the transfer chamber 303A and the substantially ambient (e.g., atmospheric) environment of the factory interface 304. The transfer chambers 303A, 303B have vacuum robots 342A, 342B disposed in the respective transfer chambers 303A, 303B. The vacuum robot 342A is capable of transferring substrates 321 between the load lock chamber 306A, 306B, the processing chambers 314A and 314F and a cooldown station 340 or a pre-clean station 342. The vacuum robot 342B is capable of transferring substrates 321 between the cooldown station 340 or pre-clean station 342 and the processing chambers 314B, 314C, 314D, and 314E.

In some embodiments, the processing chambers 314A, 314B, 314C, 314D, 314E, and 314F are coupled to the transfer chambers 303A, 303B. The processing chambers 314A, 314B, 314C, 314D, 314E, and 314F may comprise, for example, an atomic layer deposition (ALD) process chamber, a physical vapor deposition (PVD) process chamber, chemical vapor deposition (CVD) chambers, annealing chambers, or the like. The chambers may include any chambers suitable to perform all or portions of the methods described herein, as discussed above, such as a dry oxide removal chamber or pre-clean chamber and an epitaxial growth chamber along with etching and deposition chambers. In some embodiments, one or more optional service chambers (shown as 316A and 316B) may be coupled to the transfer chamber 303A. The service chambers 316A and 316B may be configured to perform other substrate processes, such as degassing, orientation, substrate metrology, cool down and the like.

The system controller 302 controls the operation of the tool 300 using a direct control of the process chambers 314A, 314B, 314C, 314D, 314E, and 314F or alternatively, by controlling the computers (or controllers) associated with the process chambers 314A, 314B, 314C, 314D, 314E, and 314F and the tool 300. In operation, the system controller 302 enables data collection and feedback from the respective chambers and systems to optimize performance of the tool 300. The system controller 302 generally includes a Central Processing Unit (CPU) 330, a memory 334, and a support circuit 332. The CPU 330 may be any form of a general-purpose computer processor that can be used in an industrial setting. The support circuit 332 is conventionally coupled to the CPU 330 and may comprise a cache, clock circuits, input/output subsystems, power supplies, and the like. Software routines, such as a method as described above may be stored in the memory 334 and, when executed by the CPU 330, transform the CPU 330 into a specific purpose computer (system controller) 302. The software routines may also be stored and/or executed by a second controller (not shown) that is located remotely from the tool 300.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of adjusting a work function of a structure on a substrate, comprising:
   growing an epitaxial layer on surfaces of the structure to form a homogeneous passivation region with dopants as part of a substrate material of the substrate; and
   performing a dopant diffusion process to further embed the dopants into surfaces of the structure to adjust the work function of the structure, wherein the dopant diffusion process is performed at less than approximately 450 degrees Celsius.

2. The method of claim 1, wherein the dopant diffusion process yields a charge in surfaces of the structure of up to plus or minus approximately $3e18/cm^3$ to approximately $3e21/cm^3$.

3. The method of claim 1, wherein the dopants are P-type or N-type.

4. The method of claim 1, wherein the dopant diffusion process forms an abrupt junction profile.

5. The method of claim 1 is performed in a back-end-of-line (BEOL) process.

6. The method of claim 1, wherein the epitaxial layer is formed of single crystals.

7. The method of claim 1, wherein the epitaxial layer is a non-crystal layer.

8. The method of claim 1, further comprising:
   growing the epitaxial layer using a low temperature process of less than approximately 450 degrees Celsius.

9. The method of claim 1, further comprising:
   forming the structure using an etch process;
   forming an oxide layer on surfaces of the structure with a dry oxide process at a temperature of less than approximately 450 degrees Celsius with a controllable oxidation thickness of approximately 1 nm to approximately 15 nm; and
   selectively removing the oxide layer from surfaces of the structure prior to growing the epitaxial layer.

10. The method of claim 9, wherein the dry oxide process is performed in a plasma oxidation chamber.

11. The method of claim 9, further comprising:
    etching the structure into the substrate to a high aspect ratio of greater than approximately 75:1.

12. A method of adjusting a work function of a structure on a substrate, comprising:
    forming a non-crystal material layer with a low temperature process on surfaces of the structure to form a homogeneous passivation region with dopants as part of a substrate material of the substrate; and
    performing a dopant diffusion process to further embed the dopants into surfaces of the structure to adjust the work function of the structure and to form an oxide layer from the non-crystal material layer, wherein the dopant diffusion process is performed at less than approximately 450 degrees Celsius and forms a charge layer with an abrupt junction profile.

13. The method of claim 12, wherein the dopant diffusion process yields a charge in surfaces of the structure of up to plus or minus approximately $3e18/cm^3$ to approximately $3e21/cm^3$.

14. The method of claim 12, wherein the dopants are P-type or N-type.

15. The method of claim 12 is performed in a back-end-of-line (BEOL) process.

16. The method of claim 12, wherein the dopant diffusion process is a condensation-based process that embeds the dopants and forms the oxide layer.

17. The method of claim 12, wherein the non-crystal material layer is formed at a temperature of less than 450 degrees Celsius and the dopant diffusion process is performed at a temperature of less than 450 degrees Celsius.

18. A non-transitory, computer readable medium having instructions stored thereon that, when executed, cause a method for adjusting a work function of a structure in a substrate to be performed, the method comprising:
    growing an epitaxial layer on surfaces of the structure to form a homogeneous passivation region as part of a substrate material of the substrate; and
    performing a dopant diffusion process to further embed the dopants into surfaces of the structure to adjust the work function of the structure, wherein the dopant diffusion process is performed at less than approximately 450 degrees Celsius.

19. The non-transitory, computer readable medium of claim 18, wherein the dopant diffusion process yields a charge in surfaces of the structure of up to plus or minus approximately $3e18/cm^3$ to approximately $3e21/cm^3$ and forms an abrupt junction profile.

20. The non-transitory, computer readable medium of claim 18, further comprising:
    growing the epitaxial layer using a low temperature process of less than approximately 450 degrees Celsius.

* * * * *